(12) United States Patent
Banerjee et al.

(10) Patent No.: US 9,024,691 B2
(45) Date of Patent: May 5, 2015

(54) ADAPTIVE POWER AMPLIFIER AND METHODS OF MAKING SAME

(71) Applicant: Georgia Tech Research Corporation, Atlanta, GA (US)

(72) Inventors: Aritra Banerjee, Atlanta, GA (US); Abhijit Chatterjee, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 38 days.

(21) Appl. No.: 13/897,152

(22) Filed: May 17, 2013

(65) Prior Publication Data
US 2014/0340152 A1 Nov. 20, 2014

(51) Int. Cl.
*H03F 3/191* (2006.01)
*H03F 3/00* (2006.01)

(52) U.S. Cl.
CPC .............. *H03F 3/005* (2013.01); *H03F 3/191* (2013.01)

(58) Field of Classification Search
USPC .......................................... 330/277, 302, 305
See application file for complete search history.

(56) References Cited

U.S. PATENT DOCUMENTS

| | | | |
|---|---|---|---|
| 6,784,732 B2 * | 8/2004 | Hajimiri et al. | 330/251 |
| 7,151,407 B2 * | 12/2006 | Grundlingh | 330/251 |
| 8,174,322 B2 * | 5/2012 | Heijden et al. | 330/295 |
| 8,593,225 B2 * | 11/2013 | Hellberg | 330/302 |
| 8,717,102 B2 * | 5/2014 | Wilson et al. | 330/302 |
| 8,803,615 B2 * | 8/2014 | Cabanillas et al. | 330/305 |

* cited by examiner

*Primary Examiner* — Khanh V Nguyen
(74) *Attorney, Agent, or Firm* — Troutman Sanders LLP; Ryan A. Schneider; Dustin B. Weeks

(57) ABSTRACT

An exemplary embodiment of the present invention provides an adaptive power amplifier comprising a transistor, a resistive load, and a tuning circuit. The transistor has a drain, a source, and a gate. The resistive load can be electrically coupled to the drain. The tuning circuit can be electrically coupled to the drain in parallel with the transistor. The tuning circuit can comprise an inductor and a capacitive element. The inductor and capacitive element can be in series connection.

17 Claims, 3 Drawing Sheets

ADAPTIVE POWER AMPLIFIER AND METHODS OF MAKING SAME

FEDERALLY SPONSORED RESEARCH STATEMENT

This invention was made with Government support under Agreement No. HR0011-10-3-0002, awarded by DARPA and under Agreement No. CCF0916270, awarded by the National Science Foundation. The Government has certain rights in the invention.

TECHNICAL FIELD OF THE INVENTION

The various embodiments of the present disclosure relate generally to electric circuits. More particularly, the various embodiments of the present invention are directed to adaptive power amplifiers.

BACKGROUND OF THE INVENTION

Modern wireless communication systems require high data rates and efficient spectrum utilization which result in non-constant envelope modulation schemes and signals having high peak-to-average power ratios ("PAPR"). This causes the power amplifier ("PA") in the transmitter to operate at large power back-off, where traditional PA's show poor efficiency. Efficiency of the power amplifier is critical in portable wireless devices as a higher efficiency of the PA leads to longer battery lifetime. Further, in base station applications, high efficiency PA's are necessary to reduce power consumption and heat sinking costs.

Process variations during the manufacturing process also give rise to problems with conventional PA's. Specifically, with more and more integration of RF power amplifiers in deeply scaled CMOS technologies, it is becoming increasingly difficult to exert sufficient control on process variations to ensure proper functionality and performance of the PA. Another challenge is posed by the reliability issues such as oxide break down and hot carrier stress, which are critical in power amplifiers due to large signal excursions.

Conventionally, the challenges of dealing with efficiency reduction with power back-off, performance degradation due to process variation, and reliability issues have been addressed by modifying traditional PA circuits. Efficiency improvement techniques include Doherty architecture, envelope tracking ("ET"), envelope elimination and restoration ("EER") techniques, out-phasing or linear amplification using nonlinear components ("LINC"), and pulse-width modulation. These techniques, however, have their own disadvantages.

Therefore, there is a desire for improved PA's that address one or more of the disadvantages discussed above. Various embodiments of the present invention address these desires.

BRIEF SUMMARY OF THE INVENTION

The present invention relates to adaptive power amplifiers and methods of providing power amplifiers. An exemplary embodiment of the present invention provides an adaptive power amplifier comprising a transistor, a resistive load, and a tuning circuit. The transistor can have a drain, a source, and a gate. The resistive load can be electrically coupled to the drain. In some embodiments, the resistive load can be electrically coupled to the drain through inductive and capacitive elements. The tuning circuit can be electrically coupled to the drain in parallel connection with the transistor. The tuning circuit can comprise an inductor and a capacitive element. The inductor and capacitive element can be in series connection.

In an exemplary embodiment of the present invention, the capacitive element can comprise a tunable capacitor.

In another exemplary embodiment of the present invention, the capacitive element can comprise a plurality of capacitors. In some embodiments of the present invention, at least two of the plurality of capacitors are in parallel connection with each other.

In another exemplary embodiment of the present invention, the capacitive element is dynamically tunable. In some embodiments of the present invention, the capacitive element is dynamically tunable by a signal processor or some dedicated digital circuits.

In another exemplary embodiment of the present invention, the capacitive element is tuned to a preselected value such that the inductor and capacitive element together form a series resonant network for a third harmonic of a carrier frequency of the adaptive power amplifier at peak output power.

Another exemplary embodiment of the present invention provides an adaptive power amplifier comprising a transistor, a first inductor, a first capacitor, a load circuit, and a tuning circuit. The transistor can have a drain terminal, a source terminal, and a gate terminal. The source terminal can be electrically coupled to an electrical ground. The gate terminal can be electrically coupled to an input. The first inductor can be electrically coupled to the drain terminal and a voltage supply. The first capacitor can be electrically coupled to the drain (this first capacitor can be the drain to source parasitic capacitance of the transistor or a separate capacitor). The load circuit can be electrically coupled to the drain in parallel with the first capacitor. The load circuit can comprise a load capacitor, a load inductor, and a resistive load connected in series with each other. The tuning circuit can be electrically coupled to the drain in parallel with the first capacitor. The tuning circuit can comprise a second inductor and a capacitive element. The second inductor and capacitive element can be in series connection.

In addition to adaptive power amplifiers, the present invention also provides methods of providing adaptive power amplifiers. An exemplary embodiment of the present invention provides a method of providing an adaptive power amplifier comprising providing a transistor having a drain, a source, and a gate, electrically coupling a resistive load to the drain, and electrically coupling a tuning circuit to the drain in parallel connection with the transistor with the tuning circuit comprising an inductor and a capacitive element in series connection.

In another exemplary embodiment of the present invention, the capacitive element can comprise a dynamically tunable capacitor and the method can further comprise tuning the tunable capacitor to a predetermined capacitance.

In another exemplary embodiment of the present invention, the capacitive element can comprise a plurality of capacitors and the method further comprises arranging the plurality of capacitors such that the capacitive element has a preselected effective capacitance. In some embodiments of the present invention, at least two of the plurality of capacitors can be in parallel connection with each other.

In another exemplary embodiment of the present invention, the method can further comprise dynamically tuning the capacitive element via a feedback loop with a digital signal processor or dedicated digital circuits.

In another exemplary embodiment of the present invention, the method can further comprise tuning the capacitive element to a preselected capacitance such that the inductor and capacitive element together form a series resonant network for a third harmonic of a carrier frequency of the adaptive power amplifier at peak output power.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of the present invention, various illustrative embodiments are explained below. To simplify and clarify explanation, the invention is described below as applied to power amplifiers.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Some embodiments of the present invention provide adaptive power amplifiers using an LC tuning circuit with a variable capacitor to address the disadvantages of conventional amplifiers. Specifically, various embodiments of the present invention provide improved efficiency with power back-off, improved reliability, and improved compensation for process variation effects. Further the tuning circuit of the present invention provides a much simpler architecture than that of conventional amplifiers.

Figure 1:
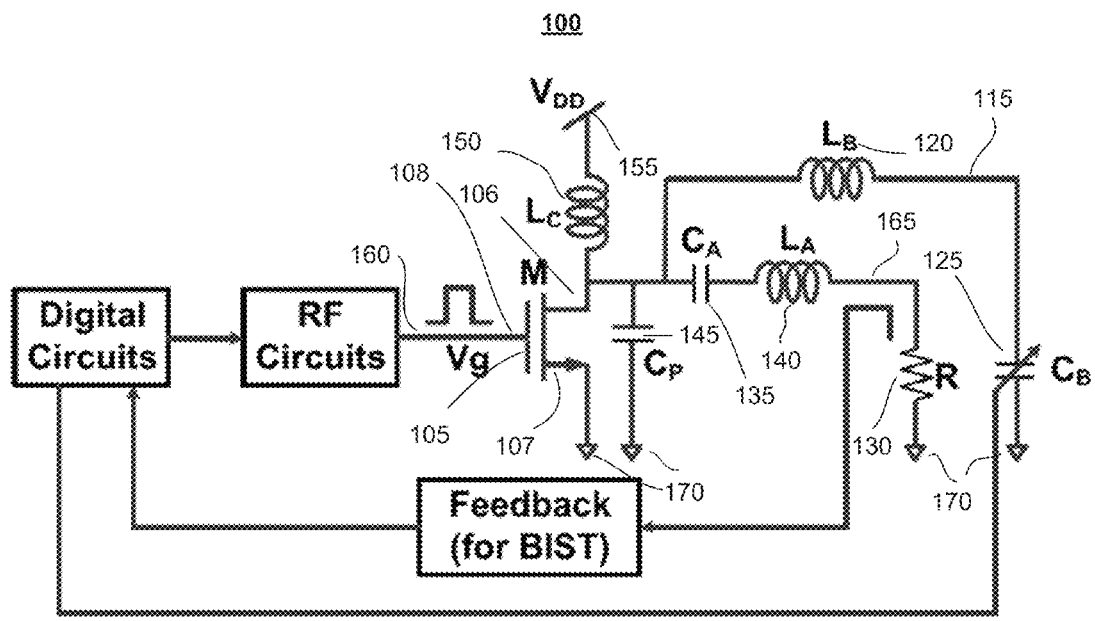
FIG. 1 provides a circuit diagram of an adaptive power amplifier, in accordance with an exemplary embodiment of the present invention.

As shown in FIG. 1, an exemplary embodiment of the present invention provides an adaptive power amplifier 100 comprising a transistor 105, a first inductor 150, a first capacitor 145, a load circuit 165, and a tuning circuit 115. The transistor 105 can be many transistors known in the art, including, but not limited to N-type MOSFET transistors, and the like. In some embodiments of the present invention, the transistor 105 can operate as a switch. In an exemplary embodiment of the present invention, the transistor is an NMOS transistor. The transistor can have a drain terminal 106, a source terminal, and a gate terminal 108. The source terminal 107 can be electrically coupled to an electrical ground 170. The gate terminal 108 can be electrically coupled to an input 160. The input 160 can be many inputs. In an exemplary embodiment of the present invention, the input 160 can be a pulse width modulated ("PWM") input signal.

The first inductor 150 can be electrically coupled to the drain terminal 106 and a voltage supply 155. The first capacitor 145 can be electrically coupled to the drain 106. The load circuit 165 can be electrically coupled to the drain 106 in parallel connection with the first capacitor 145. The load circuit 165 can comprise a load capacitor 135, a load inductor 140, and a resistive load 130 in series connection.

The tuning circuit 115 can be electrically coupled to the drain 106 in parallel with the first capacitor 145. The tuning circuit 115 can also be in parallel with the load circuit 165. The tuning circuit 115 can comprise a second inductor 120 and a capacitive element 125. The second inductor 120 and capacitive element 125 can be in series connection.

The capacitive element 125 can be many capacitive elements or capacitive systems known in the art. In an exemplary embodiment of the present invention, the capacitive element 125 can be tunable, i.e., the effective capacitance of the capacitive element 125 can be controlled. In some embodiments, the capacitive element 125 comprises a single tunable capacitor. In another exemplary embodiment of the present invention, the capacitive element 125 is dynamically tunable, i.e., the capacitance of the capacitive element 125 can be altered during operation of the amplifier 100. In some embodiments of the present invention, the capacitive element 125 is dynamically tunable by a signal processor or dedicated digital circuits. In some embodiments of the present invention, the capacitive element 125 can comprise a plurality of capacitors. In some embodiments of the present invention, at least two of the plurality of capacitors are in parallel connection with each other. For example, the capacitive element 125 can comprise plurality of parallel connected switch-capacitors. Each switch-capacitor can comprise a switch, e.g. transistor, and a capacitor serially connected. In such an embodiment, the effective capacitance of the capacitive element 125 can be tuned to a preselected effective capacitance by opening and closing one or more of the switches of the switch-capacitors. In some embodiments of the present invention, a signal processor or dedicated digital circuits can be operative to open and close one or more of the switches of the switch-capacitors, and thus tune the capacitive element 125. Accordingly, in some embodiment of the present invention, the capacitive element 125 can be dynamically tunable to control its effective capacitance during operation of the power amplifier 100 to improve one or more characteristics of the amplifier, e.g., efficiency.

The adaptive power amplifier shown in FIG. 1 is merely one exemplary embodiment of the present invention. The present invention is not limited to the specific embodiment shown in FIG. 1. For example, another exemplary embodiment of the present invention provides an adaptive power amplifier comprising a transistor 105, a resistive load 130, and a tuning circuit 115. The resistive load can be electrically coupled to transistor 105. The tuning circuit 115 can be electrically coupled to the transistor 105 in parallel connection with the transistor 105. The tuning circuit 115 can comprise an inductor 120 and a capacitive element 125. The inductor 120 and capacitive element 125 can be in serial connection.

As discussed above, various embodiments of the present invention offer improved reliability over conventional amplifiers. The output power achievable in a class-E power amplifier is limited by the constraints on the maximum drain voltage swing of the transistor 105 as high peak drain voltage can cause break-down. For peak output power (50% duty cycle) and power levels close to peak power, in some embodiments of the present invention, the capacitance of the capacitive element 125 can be set in such a way that the capacitive element 125 and the inductor 120 form a series resonance network tuned to the $3^{rd}$ harmonic of the carrier frequency, thus introducing a $3^{rd}$ harmonic current in the circuit that charges the first capacitor 145 when the gate voltage is low and the transistor 105 is turned off. This $3^{rd}$ harmonic contribution shapes the drain voltage waveform in such a way that the peak value of the drain voltage can be reduced and hence it improves reliability of the power amplifier. In this case, the power amplifier can operate in class-E/$F_3$ mode. The present invention is not limited to the $3^{rd}$ harmonic contribution; instead, as those skilled in the art would recognize, the capacitive element 125 may be tuned to introduce other harmonics, which would still provide improved reliability over conventional amplifiers.

Various embodiments of the present invention can also provide improved efficiency over conventional amplifiers. High peak-to-average power ratio in a modulated signal forces the power amplifier to operate at large power back-off where power amplifiers perform poorly in terms of efficiency. Class-E power amplifiers show very high efficiency due to ZVS and ZdVS conditions, which ensure that when the transistor 105 is turned on, voltage across the transistor 105 is minimal and power loss due to discharge of the first capacitor 145 is minimized. In a static design of class-E power amplifier, ZVS and ZdVS conditions can be satisfied at a fixed duty cycle of the driving waveform and for other duty cycles discharge of the first capacitor 145 reduces efficiency. Accordingly, in some embodiments of the present invention, an adaptive power amplifier is designed to satisfy zero voltage switching condition at 50% duty cycle. For other duty cycles, the capacitor element can be tuned properly so that the current introduced by the tuning circuit shapes the drain voltage in such a way that it minimizes the voltage across the switch when it is turned on. This leads to improvement of efficiency with power back-off. While determining the values of the capacitance of the capacitive element 125 for different duty cycles, it is also ensured that introduction of the additional current does not create a high peak voltage at the drain 106 of the transistor 105 and thus maintains reliability of the device at all duty cycles. In some embodiments of the present invention, for improving efficiency with power back-off, dynamic adaptation of the capacitive element 125 can be performed at the envelope frequency only.

Various embodiments of the present invention can also provide improved tolerance to process variations. With scaling of CMOS transistors, RF circuits are becoming more and more susceptible to process variation and maintaining the required performance of the circuit in presence of such manufacturing defects is a big challenge. Self-healing techniques attempt to ensure that by making RF circuits tunable and using available on-chip digital logic to control the values of the tuning knobs, effects of process variation can be mitigated. Process variation can affect the active and passive components and results in degradation of performance. With the present invention, however, it can be shown that in the presence of process variation, optimal settings of the capacitor element 125 with duty cycle variation will be different from the nominal case. Using built-in-self-test ("BIST") techniques, effects of process variation can be detected and settings of the capacitive element 125 can be determined accordingly to obtain best possible performance from that particular process shifted instance.

Analysis of a tuning circuit 115 in accordance with an exemplary embodiment of the present invention is discussed below. The tuning circuit 115 can contribute a current that charges the parallel capacitor 145 and modifies the drain waveform of the transistor switch 105. In some embodiments of the present invention, for peak output power (50% duty cycle), the tuning circuit 115 creates a series resonant network for $3^{rd}$ harmonic of the carrier frequency such that $3 f_0 = 1/(2\pi\sqrt{L_B C_B})$ where $f_0$ is the carrier frequency. The tuning circuit 115 can also reduce peak drain voltage such that the amplifier 100 actually operates in class-E/$F_3$ mode. The following analysis shows how the tuning circuit affects the drain swing of the transistor 105 for 50% duty cycle.

Class-E power amplifiers operate based on the principle of zero voltage switching ("ZVS") and zero voltage slope switching ("ZdVS"). The transistor 105, which can behave as a switch, is turned on when the voltage across the transistor 105 and its slope are both zero which, in the ideal case, ensures that no power is lost due to the discharge of the parallel capacitor 145 and high efficiency is achieved. The ZVS and ZdVS conditions can be written as shown in Equations 1 and 2.

$$V_D(2\pi/\omega) = 0 \qquad \text{Equation 1}$$

$$\left.\frac{dV_D(t)}{dt}\right|_{t=2\pi/\omega} = 0 \qquad \text{Equation 2}$$

In Equations 1 and 2, $V_D(t)$ is the drain voltage of the switching transistor 105, the switch 105 is closed during the time interval $0 \leq t < d\pi/\omega$ and open during $d\pi/\omega \leq t < 2\pi/\omega$, and $\omega$ and $d$ denote the angular switching frequency and duty cycle, respectively. When the switch 105 is open, the current flowing in the tuning circuit 115 charges the parallel capacitor 145, and current through the capacitor 145 in the presence of the tuning circuit 115 can be written as shown in Equation 3.

$$I_C(t) = \frac{1}{L_C}\int_{d\pi/\omega}^{t} (V_{DD} - V_D(t))\,dt + I_L(d\pi/\omega) + I_A(t) + I_B(t) \qquad \text{Equation 3}$$

In Equation 3, $L_C$ is the inductor 150 connecting the drain 106 to the supply ($V_{DD}$) 155 and $I_L(t)$, $I_4(t)=I_f \sin(\omega t+\phi_1)$ and $I_B(t)=I_{3f} \sin(3\omega t+\phi_3)$ are the currents flowing through the inductor 150 $L_C$, the resistive load 130 R and the tuning circuit 115, respectively. Equation (3) can be written in the form of differential equation shown in Equation 4.

$$L_C C_P \frac{d^2 V_D(t)}{dt^2} + V_D(t) - V_{DD} - \omega L_C I_f \cos(\omega t + \phi_1) - 3\omega L_C I_{3f} \cos(3\omega t + \phi_3) = 0 \quad \text{Equation 4}$$

By solving for Equation 4, the drain voltage of the NMOS transistor can be found as shown in Equation 5.

$$V_D(t) = A_1 \cos\left(\frac{t}{\sqrt{L_C C_P}}\right) + A_2 \sin\left(\frac{t}{\sqrt{L_C C_P}}\right) + V_{DD} + \frac{\omega L_C I_f}{1-\omega^2 L_C C_P}\cos(\omega t+\phi_1) + \frac{3\omega L_C I_{3f}}{1-9\omega^2 L_C C_P}\cos(3\omega t+\phi_3) \quad \text{Equation 5}$$

In Equation 5, values of $A_1$ and $A_2$ can be found from the conditions given in Equations 1 and 2. The last term in Equation 5 is the contribution of the third harmonic current flowing in the tuning circuit, and this third harmonic component, added with other terms in Equation 5, shapes the drain waveform in such a way that peak swing is reduced as compared to the case when there is no third harmonic current.

For other duty cycles, capacitance of the capacitive element 125 can be changed, which results in a different shaping that minimizes the voltage across the transistor 105 at the time when the switch 105 is turned on.

Experimental results obtained with an exemplary embodiment of the present invention will now be described. The exemplary power amplifier was designed in an advanced 65 nm CMOS process for 2.4 GHz frequency. A finite inductor was used in placed of the choke inductor Lc. The inductor was assumed to be on chip with a quality factor of 10. The results are illustrated in FIGS. 2-6, in accordance with an exemplary embodiment of the present invention.

Figure 2:
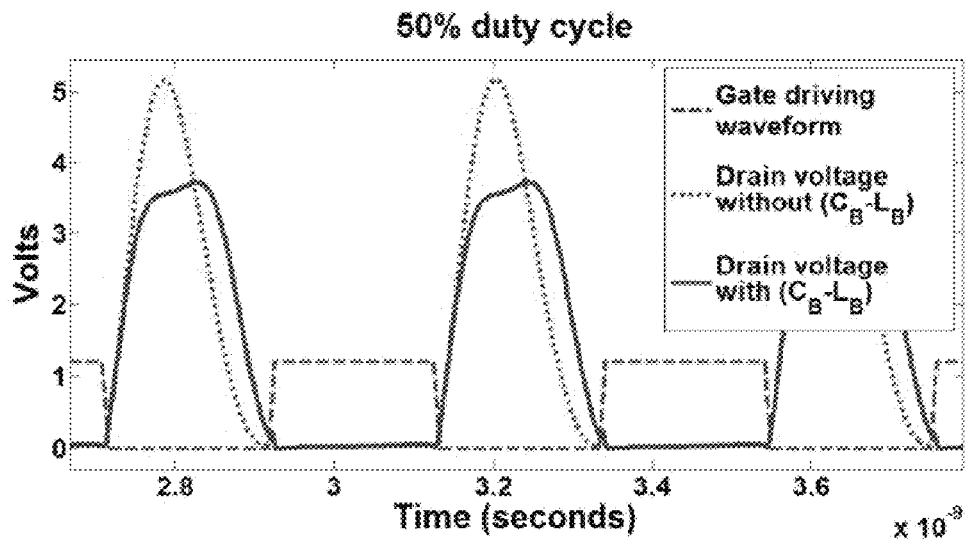
FIG. 2 provides a drain waveform with and without a tuning circuit for 50% duty cycle, in accordance with an exemplary embodiment of the present invention.

Tuning for Reliability: FIG. 2 shows gate driving waveform with 50% duty cycle and zero voltage switching waveform at the drain of the NMOS switch with and without the tuning circuit ($L_B$–$C_B$). In this case when the gate driving waveform has 50% duty cycle, $C_B$ is tuned such that $C_B$ and $L_B$ form a series resonant circuit at $3^{rd}$ harmonic which is 7.2 GHz. This $3^{rd}$ harmonic current reduces the peak of the drain voltage swing from 5.1 volts to 3.7 volts as shown in FIG. 2 and thus improves the reliability of the power amplifier. 100 mW of peak output power is obtained from the power amplifier at 50% duty cycle with 76% peak efficiency. The efficiency loss is contributed by resistive components of the inductors and finite on-resistance of the NMOS switch.

Figure 3:
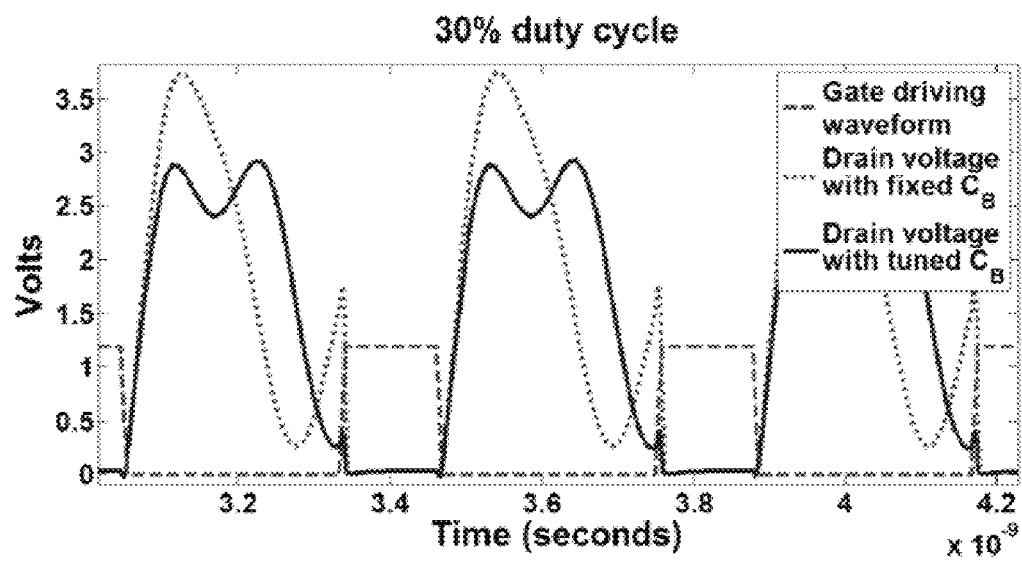
FIG. 3 provides a drain waveform with a fixed capacitor in the tuning circuit and capacitance value tuned for 30% duty cycle, in accordance with an exemplary embodiment of the present invention.
Figure 4:
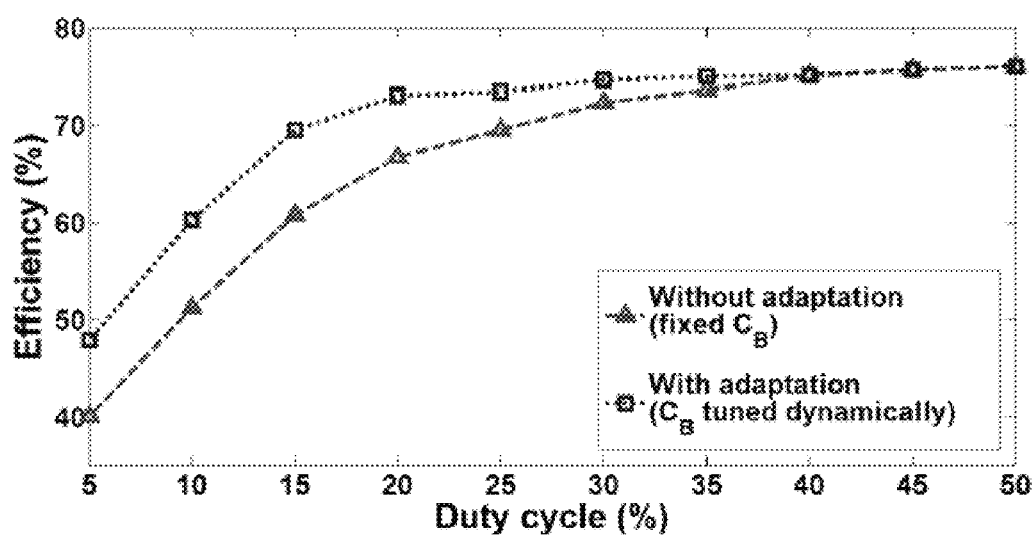
FIG. 4 provides a plot of the efficiency of a power amplifier for different duty cycles of the driving waveform with fixed capacitor and with dynamically tuned capacitor, in accordance with an exemplary embodiment of the present invention.

Tuning for Efficiency: Power back-off is created by reducing the duty cycle of the gate driving waveform. At a lower duty cycle, ZVS condition gets violated and the switch is turned on when there is significant voltage across the switch. This results in discharge of the capacitor $C_P$ and loss of efficiency. By tuning $C_B$ properly and controlling the current added by the network $C_B$–$L_B$, drain voltage waveform can be modified such that voltage across the switch is reduced at the time of turn on for any duty cycle. This reduces power dissipation due to discharge of capacitor $C_P$ which in turn improves efficiency at lower duty cycles. FIG. 3 shows two cases: drain voltage waveforms at 30% duty cycle with $C_B$ kept fixed at its value of 50% duty cycle ($C_B$–$L_B$ tuned to the $3^{rd}$ harmonic) and with $C_B$ tuned properly to reduce drain voltage at turn on time for 30% duty cycle. It is evident from FIG. 3 that by tuning $C_B$ properly at different duty cycles, power dissipation can be reduced. While tuning $C_B$ to improve efficiency, it is also ensured that peak of drain voltage does not go beyond 3.7 volts which is the reliability limit. FIG. 4 shows efficiency of the power amplifier at different duty cycles with $C_B$ tuned to reduce power dissipation and with $C_B$ kept fixed at its value of 50% duty cycle (class-E/$F_3$ operation). It is evident from FIG. 4 that tuning $C_B$ for different duty cycles can improve efficiency significantly with power back-off. Capacitance values of $C_B$ required at different duty cycles to achieve this efficiency improvement are plotted in FIG. 5 which shows that a tuning range of 0.5 pF to 2.1 pF is needed. As discussed above, this tunable capacitor $C_B$ can be implemented as a varactor or as a set of unit capacitors connected through switches where different amounts of capacitance can be obtained by turning on appropriate number of switches.

Figure 5:
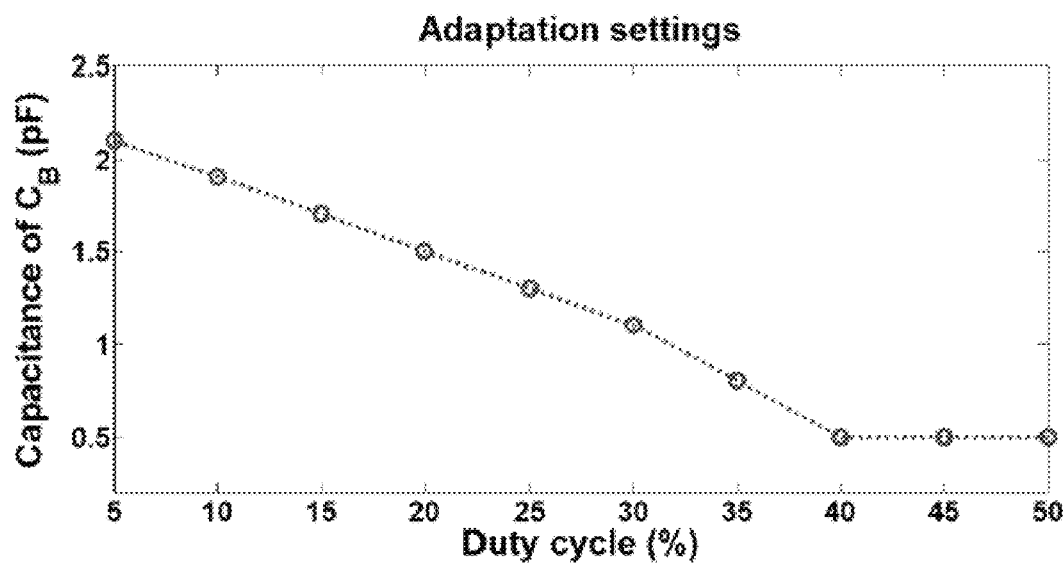
FIG. 5 provides a plot of various capacitance values of the capacitor of the tuning circuit for improving efficiency at different duty cycles, in accordance with an exemplary embodiment of the present invention.
Figure 6:
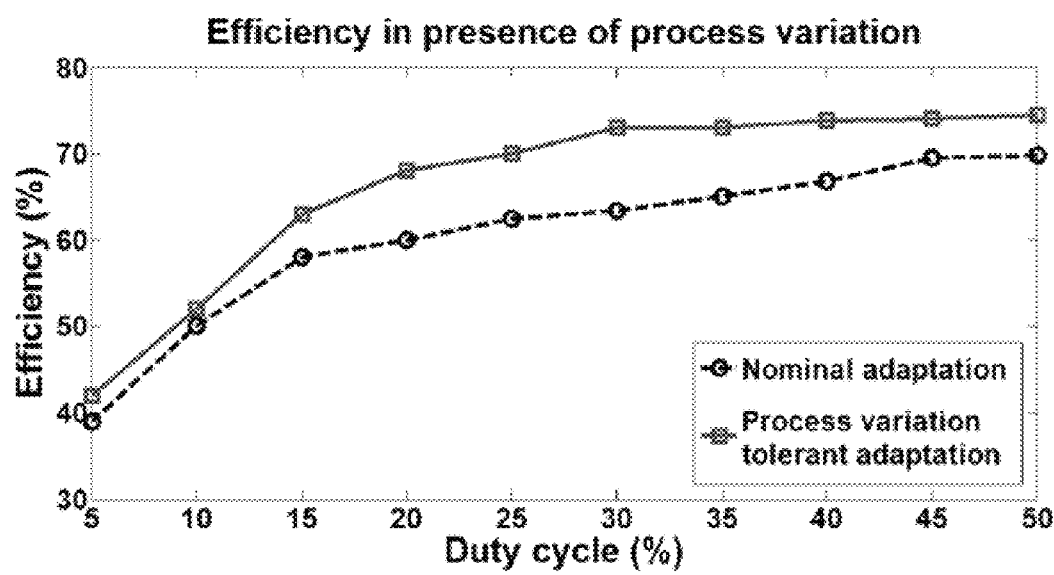
FIG. 6 provides a plot of the efficiency of a power amplifier at different duty cycles for nominal adaptation and process variation tolerant adaptation, in accordance with an exemplary embodiment of the present invention.

Tuning for Process Variation Tolerance: Process variation effects were introduced in the simulation framework and a particular process shifted instance of the PA was considered to validate the proposed process variation tolerant adaptation scheme. This exemplary PA instance is simulated with different duty cycles of the driving waveform with $C_B$ tuned dynamically as shown in FIG. 5 (nominal adaptation) and efficiency is measured. Now, the adaptation settings computed for the nominal instance may not be optimal for a process shifted instance and performance improvement is possible by finding out best adaptation settings for that particular instance. This can be done by applying BIST techniques and measuring performance of the PA using on-chip sensors and using integrated digital signal processor to determine best tuning knob settings for a process varied instance in a standard self-healing framework. Optimal settings of $C_B$ at different duty cycles can be computed for the process shifted PA considered in our simulation so that efficiency is maximized without violating the reliability constraint of peak drain voltage swing. The optimal adaptation settings for this instance are found to be different from that of a nominal instance. Efficiency values of the process shifted instance are shown in FIG. 6 with nominal adaptation (broken line) and optimal adaptation for this particular instance (solid line). It is evident from FIG. 6 that using this process variation tolerant adaptation scheme, performance degradation (efficiency reduction) due to process shift can be mitigated to certain extent by finding out best adaptation settings for each process varied instance. If due to process variation, capacitance values of $C_B$ change at different settings, such changes will be taken care of by the proposed process variation tolerant adaptation scheme as it finds out the best setting to maximize efficiency without violating reliability constraints at each duty cycle.

While various embodiments above are discussed as having a tunable capacitive element in the tuning circuit, those skilled in the art would also appreciate that appreciate that various embodiments of the present invention can also include a tunable inductive element in the tuning circuit. For example, the tuning circuit 115 can comprise a tunable inductive element and a fixed capacitive element, a fixed inductive element and a tunable capacitive element, or a tunable inductive element and a tunable capacitive element, in accordance with various embodiments of the present invention. Further, similar to the capacitive element, the inductive element could also comprise a plurality of inductors. In some embodiments of the present invention, at least two of the plurality of inductors are connected in parallel. In some embodiments of the present invention, the plurality of inductors are connected in parallel with switches. In some embodiments of the present invention, a signal processor or dedicated digital circuits could be used to dynamically tune the inductive element to a predetermined inductance, similar to how the capacitive element can be tuned.

As discussed above, in addition to adaptive power amplifiers, the present invention also provides methods of providing adaptive power amplifiers. The various steps described above can be used to carry out various methods of providing adaptive power amplifiers. An exemplary embodiment of the present invention provides a method of providing an adaptive power amplifier comprising providing a transistor having a drain, a source, and a gate, electrically coupling a resistive load to the drain, and electrically coupling a tuning circuit to the drain in parallel with the transistor with the tuning circuit comprising an inductor and a capacitive element in series connection.

In another exemplary embodiment of the present invention, the capacitive element can comprise a dynamically tunable capacitor and the method can further comprise tuning the tunable capacitor to a predetermined capacitance.

In another exemplary embodiment of the present invention, the capacitive element can comprise a plurality of capacitors and the method further comprises arranging the plurality of capacitors such that the capacitive element has a preselected effective capacitance. In some embodiments of the present invention, at least two of the plurality of capacitors can be in parallel connection with each other.

In another exemplary embodiment of the present invention, the method can further comprise dynamically tuning the capacitive element via a feedback loop with a digital signal processor or dedicated digital circuits.

In another exemplary embodiment of the present invention, the method can further comprise tuning the capacitive element to a preselected capacitance such that the inductor and capacitive element together form a series resonant network for a third harmonic of a carrier frequency of the adaptive power amplifier at peak output power.

In many of the exemplary embodiments of the present invention discussed above, the tuning circuit is shown as including an inductive element and a capacitive element connected in series. Those skilled in the art, however, would appreciate that the tuning circuit of the present invention can take many different forms for introducing harmonic currents in the circuit that charge the first capacitor 145 when the gate voltage is low and the transistor 105 is turned off.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. An adaptive power amplifier comprising:
   a transistor having a drain, a source, and a gate;
   a resistive load electrically coupled to the drain; and
   a tuning circuit electrically coupled to the drain in parallel with the transistor, the tuning circuit comprising an inductor and a capacitive element, the inductor and capacitive element in series connection,
   wherein the capacitive element of the tuning circuit is tuned to a preselected value such that the inductor and capacitive element together form a series resonant network for a third harmonic of a carrier frequency of the adaptive power amplifier at peak output power.

2. The adaptive power amplifier of claim 1, wherein the capacitive element comprises a tunable capacitor.

3. The adaptive power amplifier of claim 1, wherein the capacitive element comprises a plurality of capacitors.

4. The adaptive power amplifier of claim 3, wherein at least two of the plurality of capacitors are connected in parallel through switches.

5. The adaptive power amplifier of claim 1, wherein the capacitive element is dynamically tunable.

6. The adaptive power amplifier of claim 1, wherein the capacitive element is dynamically tunable by a signal processor or dedicated digital circuits.

7. An adaptive power amplifier, comprising:
   a transistor having a drain terminal, a source terminal, and a gate terminal, wherein the source terminal is electrically coupled to an electrical ground, and wherein the gate terminal is electrically coupled to an input;
   a first inductor electrically coupled to the drain terminal and a voltage supply;
   a first capacitor electrically coupled to the drain terminal;
   a load circuit electrically coupled to the drain terminal in parallel with the first capacitor, the load circuit comprising a load capacitor, a load inductor, and a resistive load in series connection with each other; and
   a tuning circuit electrically coupled to the drain in parallel with the first capacitor, the tuning circuit comprising a second inductor and a capacitive element, the second inductor and capacitive element in series connection,
   wherein the capacitive element of the tuning circuit is tuned to a preselected value such that the second inductor and capacitive element together form a series resonant network for a third harmonic of a carrier frequency of the adaptive power amplifier at peak output power.

8. The adaptive power amplifier of claim 7, wherein the capacitive element comprises a tunable capacitor.

9. The adaptive power amplifier of claim 7, wherein the capacitive element comprises a plurality of capacitors.

10. The adaptive power amplifier of claim 9, wherein at least two of the plurality of capacitors are connected in parallel through switches.

11. The adaptive power amplifier of claim 7, wherein the capacitive element is dynamically tunable.

12. The adaptive power amplifier of claim 7, wherein the capacitive element is dynamically tunable by a signal processor or dedicated digital circuits.

13. A method of providing an adaptive power amplifier, comprising:
   providing a transistor having a drain, a source, and a gate;
   electrically coupling a resistive load to the drain;
   electrically coupling a tuning circuit to the drain in parallel with the transistor, the tuning circuit comprising an inductor and a capacitive element, the inductor and capacitive element in series connection; and
   tuning the capacitive element to a preselected capacitance such that the inductor and capacitive element together form a series resonant network for a third harmonic of a carrier frequency of the adaptive power amplifier at peak output power.

14. The method of providing an adaptive power amplifier of claim 13, wherein the capacitive element comprises a dynamically tunable capacitor, the method further comprising tuning the tunable capacitor to a predetermined capacitance.

15. The method of providing an adaptive power amplifier of claim 13, wherein the capacitive element comprises a plurality of capacitors, the method further comprising arranging the plurality of capacitors such that the capacitive element has an preselected effective capacitance.

16. The method of providing an adaptive power amplifier of claim 15, wherein at least two of the plurality of capacitors are connected in parallel through switches.

17. The method of providing an adaptive power amplifier of claim 13, further comprising dynamically tuning the capacitive element via a feedback loop with a digital signal processor or dedicated digital circuits.

* * * * *